(12) United States Patent
Durham et al.

(10) Patent No.: US 6,285,217 B1
(45) Date of Patent: Sep. 4, 2001

(54) DYNAMIC LOGIC CIRCUITS WITH REDUCED EVALUATION TIME

(75) Inventors: Christopher McCall Durham, Round Rock; Peter Juergen Klim, Austin, both of TX (US); Younes Lofti, Colorado Springs, CO (US); John Beck, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/391,423

(22) Filed: Sep. 8, 1999

(51) Int. Cl.[7] ................................................ H03K 19/096
(52) U.S. Cl. ............................ 326/95; 326/98; 326/93; 327/51
(58) Field of Search .................... 326/17, 83, 93, 326/95, 96, 97, 121, 98; 327/51–57

(56) References Cited

U.S. PATENT DOCUMENTS

| | | | |
|---|---|---|---|
| 5,543,735 | * 8/1996 | Lo ........................................ | 326/93 |
| 5,757,205 | * 5/1998 | Ciraula et al. ...................... | 326/21 |
| 5,920,218 | * 7/1999 | Klass et al. ......................... | 327/200 |
| 5,986,475 | * 11/1999 | Kim et al. ........................... | 326/95 |
| 6,118,304 | * 9/2000 | Potter et al. ....................... | 326/93 |
| 6,127,853 | * 10/2000 | Yu ...................................... | 327/55 |
| 6,137,319 | * 10/2000 | Krishnamurthy et al. ......... | 327/51 |
| 6,147,514 | * 11/2000 | Shiratake ........................... | 327/55 |

* cited by examiner

Primary Examiner—Michael Tokar
Assistant Examiner—Vibol Tan
(74) Attorney, Agent, or Firm—Mark E. McBurney; Bracewell & Patterson, L.L.P.

(57) ABSTRACT

Dynamic logic circuits with reduced evaluation time provide faster output in dynamically evaluating logic circuits by increasing the rate of change of the voltage at the junction of logic input ladders. The circuits use a cross-coupled amplifier to charge the input ladder combining node once the node begins to evaluate.

12 Claims, 8 Drawing Sheets

DYNAMIC LOGIC CIRCUITS WITH REDUCED EVALUATION TIME

BACKGROUND OF THE INVENTION

1. Technical Field

The present invention generally relates to dynamic logic gates, and more particularly to logic gates with short evaluation times.

2. Description of Related Art

Dynamic logic circuits are well known in the art. Dynamic Random Access Memory (RAM) arrays use dynamic logic to decrease device count, and microprocessors use dynamic logic to decrease device count and increase speed. Referred to as domino circuits, clocked dynamic logic performs evaluation and storage functions in VLSI (Very Large Scale Integration) designs and is a preferred topology in microprocessors and memory devices designed for high speed operation.

In order to achieve high speed in dynamic logic circuits, control signals are used to precharge nodes in the circuits to known values, typically at or near one of the power supply rails. There is typically a precharge state and then an evaluation state in which the logic evaluation takes place.

Several domino circuit families are in widespread use today. These can include footed types, where the logic ladders are disconnected from one rail during the precharge phase, or unfooted designs. They can also be single rail or dual rail. Dual rail designs use differential ladders and provide complementary outputs. Another topology is the pseudo-clocked topology, where one of the logic inputs is used to control the evaluation state.

Figure 1:
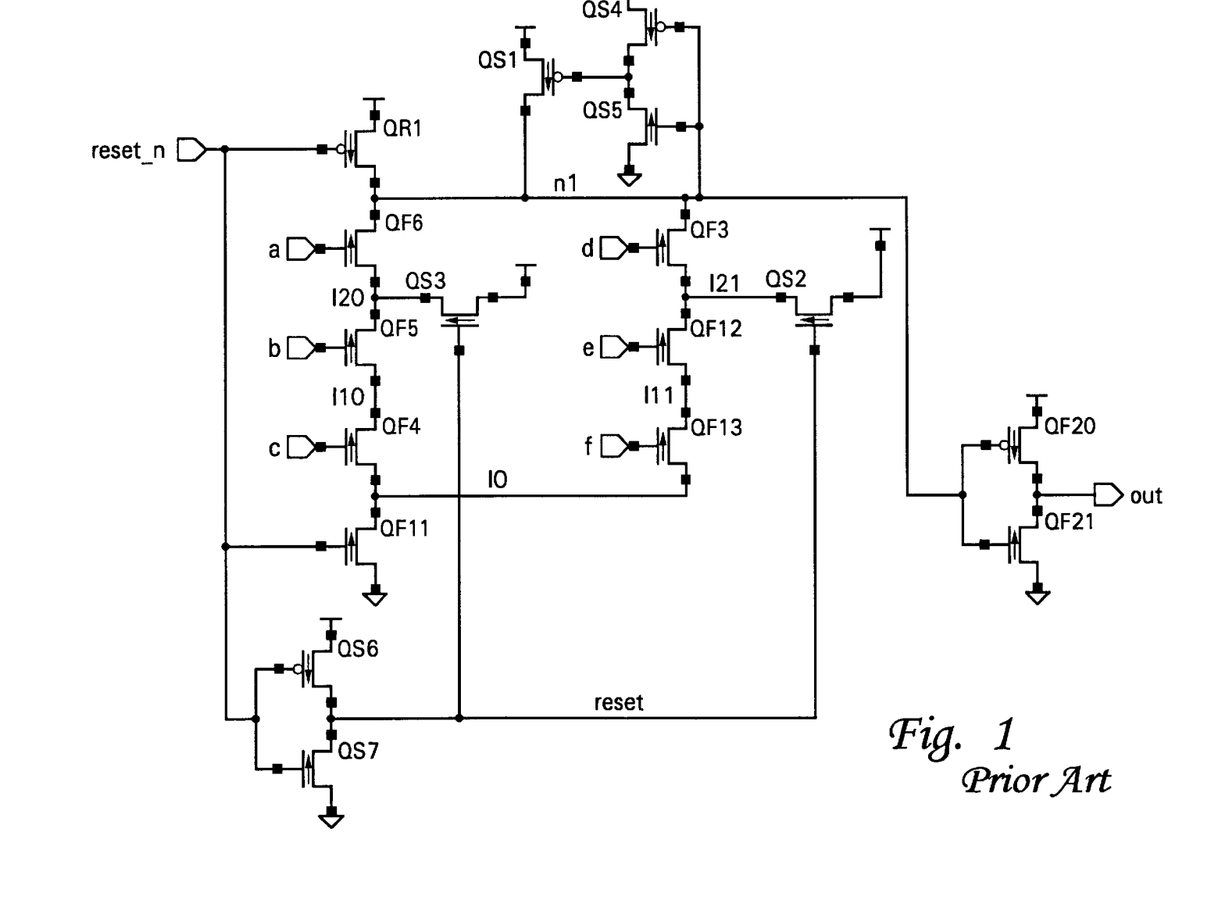
FIG. 1 is an electrical schematic of a prior art footed single ended AND/OR dynamic logic gate.

In a logic gate, evaluation of the AND-OR logical product-sum function is typically provided by ladders of input transistors, where serial connection of transistor sources and drains provide an AND function. By way of example, referring to FIG. 1, NFETS QF4, QF5 and QF6 form one such input ladder. Unless all of these devices are on, the ladder does not lower the voltage at node n1. Parallel connection of these AND ladders provides the OR function. NFETS QF3, QF12 and QF13 provide a second AND ladder. Both of these ladders must be inactive for the voltage at node n1 to remain precharged during an evaluation cycle, therefore the parallel combination accomplishes an OR function. As more OR terms are added, more parallel switching ladders add capacitive loading to the evaluation node. As more AND terms are added, the transistor areas have to be increased to maintain the same resistive path to the rail. Footing transistors such as QF11 likewise have to be increased in size as more AND terms are added. If the resistive path increases, the evaluation speed of the gate will suffer and the switching ability of the AND ladder will be reduced due to higher voltage at the node at the top of the AND ladder. Again referring to FIG. 1, by way of example, device QF6 has a higher turn on threshold than QF4, since the voltage at the source of QF6 is higher by the potential across QF4 and QF5. This affects the switching speed at input a, which sets a practical limitation on the number of AND terms which can be obtained in a ladder for a fixed transistor area. Increasing the area of the transistors also increases the capacitive loading at the evaluation node. This capacitive loading increases the evaluation time of the dynamic logic gate.

It would, therefore, be desirable to provide a dynamic logic circuit with reduced evaluation time, so that more AND and OR terms can be added to a gate for a desired evaluation speed.

SUMMARY OF THE INVENTION

It is therefore one object of the present invention to provide a logic circuit with reduced evaluation time.

It is therefore another object of the present invention to provide a logic circuit with reduced evaluation time that provides a means for increasing the rate of change of the voltage at the output of a logic input ladder.

It is yet another object of the present invention to provide a logic circuit that includes a cross-coupled amplifier to increase the rate of change of a voltage at an output node of a logic input ladder.

The foregoing objects are achieved in an enhanced dynamic logic circuit that includes a means for increasing the rate of change of the voltage at the output of the logic input ladder by connecting a cross-coupled amplifier to the output of the input ladder and precharging both the amplifier and output nodes of the input ladder during the precharge state. The cross-coupled amplifier increases the rate of change of the voltage at the output of the logic input ladder to reduce evaluation time.

The above as well as additional objectives, features, and advantages of the present invention will become apparent in the following detailed written description.

DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE ILLUSTRATIVE EMBODIMENTS

Figure 2:
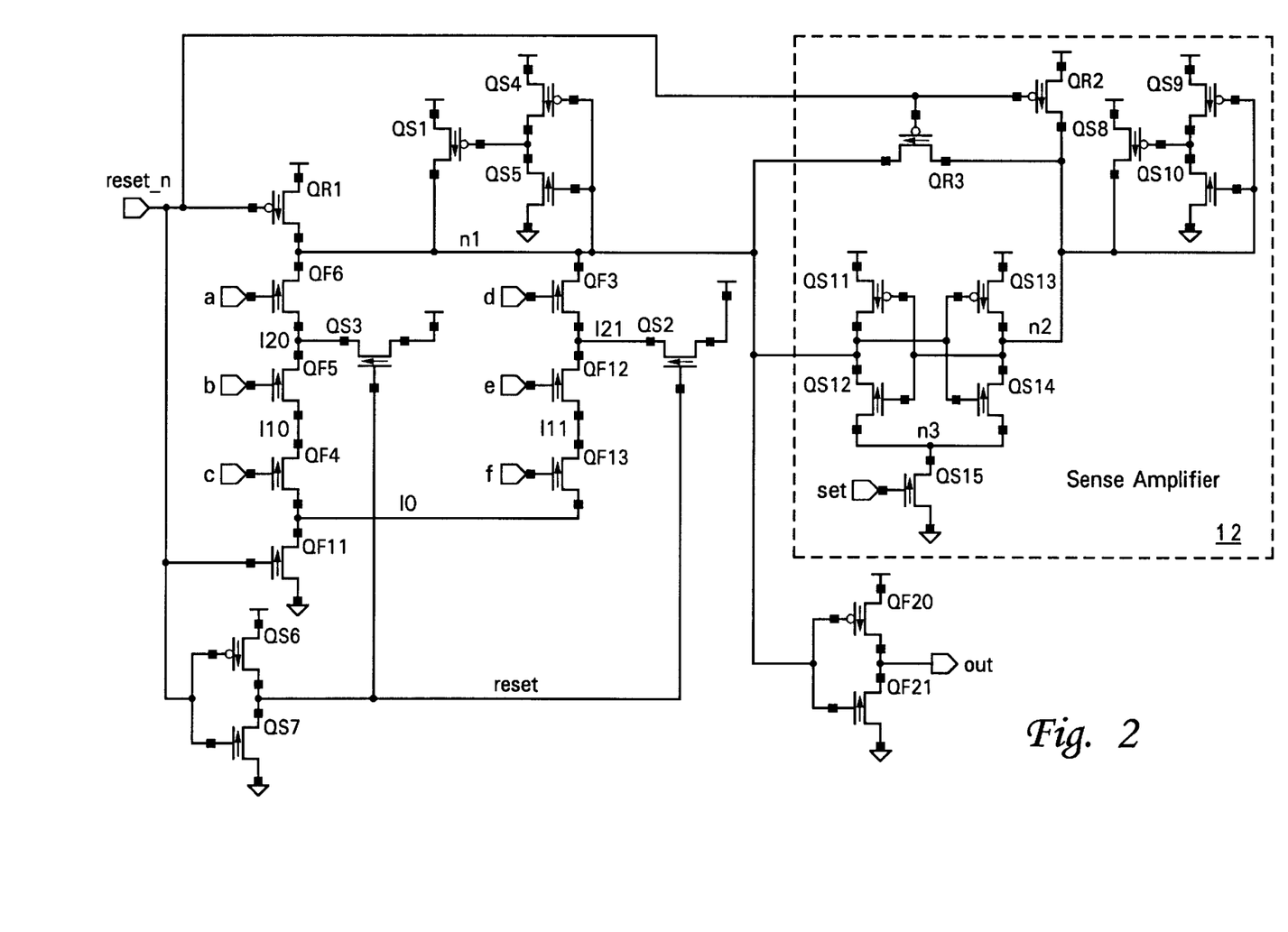
FIG. 2 is an electrical schematic of a footed single ended AND/OR dynamic logic gate with a cross-coupled sense amplifier of the present invention connected to increase the rate of change of the evaluating node.

With reference now to the figures, and in particular with reference to FIG. 2, there is depicted one embodiment of an enhanced dynamic logic circuit constructed in accordance with one embodiment the present invention.

This is an example a footed, single rail configuration AND/OR logic gate, with the techniques of the present invention applied.

This circuit performs the function a·b·c+d·e·f ("+" representing the OR operator, "·" Representing AND) as follows:

NFETS QF6, QF5, and QF4 form a series AND ladder, when input reset n is low, the gate is in the reset, or precharge state. The ladder, with output at node n1, performs the logic function !(a·b·c) where "!" is a logical inversion. NFET QF11 is off, disconnecting the ladder and PFET QR1 is on, allowing node n1 to charge to the power supply rail. NFET QS3 is a ladder precharge means which charges node I20 to one NFET threshold voltage below the power supply rail. NFET QS3 must be sized appropriately to accomplish this during the reset interval.

This is done to prevent a condition in which the logic gate will not evaluate. If during a prior evaluation cycle, QF4 and QF5 were on, nodes I20 and I10 would be charged to a voltage near ground potential. If, during the next evaluation cycle, the gates of QF6, and QF5 are high and the gate of QF4. is low, the circuit would misevaluate by drawing current out of node n1, since the voltage at nodes I10 and I20 would be low. Precharging node I20 by means of ladder precharge transistor QS3, provides that the node n1 will not discharge due to this leftover charge state. The node I20 is charged to one NFET threshold below the power supply rail. Transistors QS6 and QS7 form an inverter to control the ladder precharge transistors QS2 and QS3. QF3, QF12 and QF13 form a second ladder in parallel to the ladder described above. The operation is identical and performs the function ! (d·e·f). The parallel connection at node n1 provides the OR combination of the two ladders and an inverter provided by QF20 and QF21 provides the output out:

!(!(a·b·c)·!(d·e·f)) which reduces to (a·b·c)+(d·e·f).

A half-latch formed by QS1, QS4 and QS5 provides a latching action for node n1 to the power supply rail. After the reset_n signal is restored to the high state (evaluation state), QS1 pulls node n1 high unless a stronger source pulls it low, turning off QS5, turning on QS4, thereby turning off QS1. This half-latch ensures that node n1 will be held high after the end of the precharge state, unless all of the transistors in one of the ladders are on.

Within the logic gate, a means for increasing the rate of change of the voltage at node n1 is included. In the preferred embodiment, this means comprises a CMOS cross-coupled sense amplifier 12. Referring still to FIG. 2 and referring additionally to FIG. 3, transistors QS11, QS12, QS13, and QS14 form a sense amplifier. When node n2 is driven high, NFET QS12 will turn on and PFET QS11 will turn off. If the set input is active, NFET QS15 will be on, so the action of the circuit will be to pull node n3 low. If node nil is pulled low by the action of the input ladders, PFET QS13 will turn on and NFET QS14 will turn off, further driving node n1 low. This cross-coupled circuit produces a bistable action, causing the amplifier to quickly assume a differential state that is forced by one input. The set input is provided to delay application of the cross coupled amplifier to node n1 until evaluation has begun. The set input is delayed until sufficient time has elapsed that node n1 has developed sufficient difference from node n2, typically, but not limited to 5–10% of the power supply voltage. In the precharge state, node n2 is connected to node n1 by a shunt means. PFET QR3 is a shunt means associated with the amplifier which is active during the precharge state when input reset_n is held low, keeping the potential at nodes n1 and n2 equal. Node n2 is also pulled high during the precharge state by PFET QR2.

Figure 3:
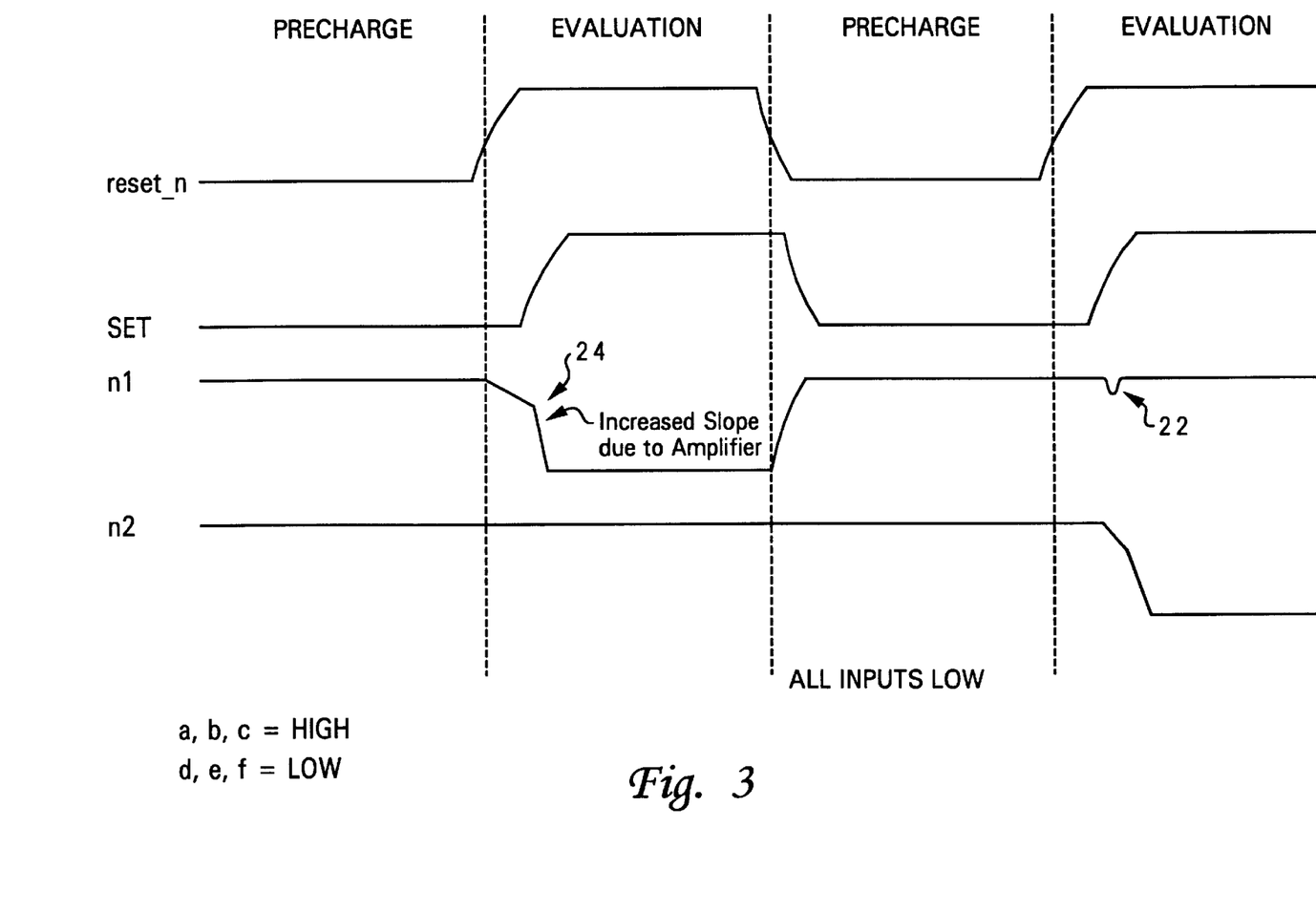
FIG. 3 is an electrical timing diagram showing the relationship of voltages in the operation of the circuit of FIG. 2.

Node n2 is further controlled by the action of a half-latch formed by QS8, QS9 and QS10. QS8 pulls node n2 high unless a stronger source pulls it low, turning off QS10, turning on QS9, thereby turning off QS8. This half latch ensures that node n2 will be held high after the end of the precharge state, until the action of the cross-coupled amplifier causes node n2 to change if node n1 evaluates to the high state. Because the capacitance of node n2 is much lower than the capacitance of node n1, the cross-coupled amplifier which will be trying to drive both node n1 and node n2 toward ground, will succeed in driving node n2 faster and node n2 will "win out" and end in the ground state, while n1 is driven back toward the power supply rail 22 (FIG. 3).

The cross-coupled amplifier is sized so that it provides lower resistance from node n1 to ground than the input ladders would alone provide. Therefore, when a condition of the input ladders cause the circuit to evaluate to a low state at node n1, the cross-coupled amplifier causes the rate of change of the voltage at n1 to be enhanced, decreasing the switching time of the circuit. This rate change 24 (FIG. 3) occurs after the activation of the set input.

Figure 4A:
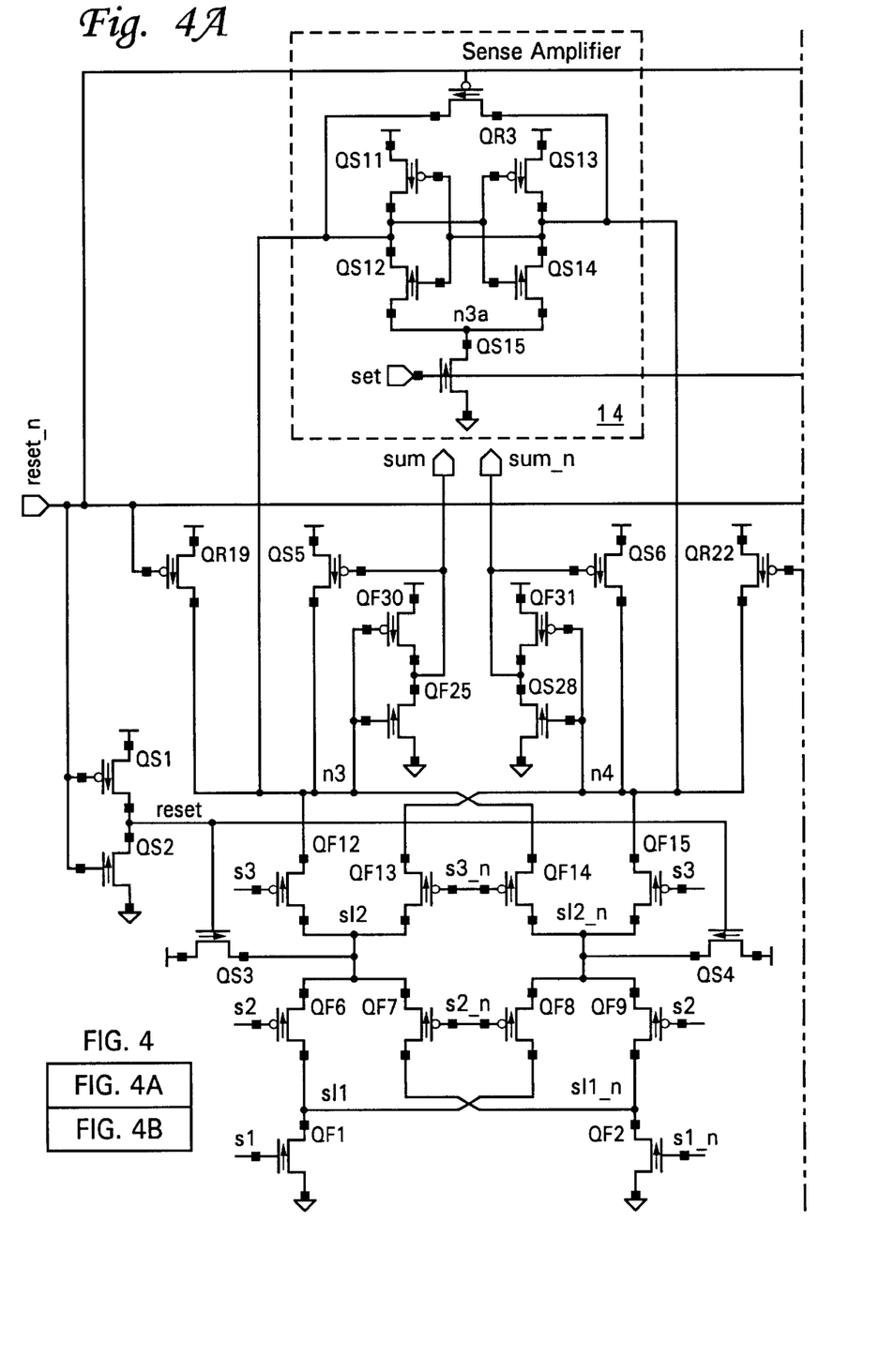
FIG. 4 is an electrical schematic of a non-footed dual rail ended carry save adder containing logic gates with cross-coupled sense amplifiers connected to increase the rate of change of the evaluating nodes.
Figure 4B:
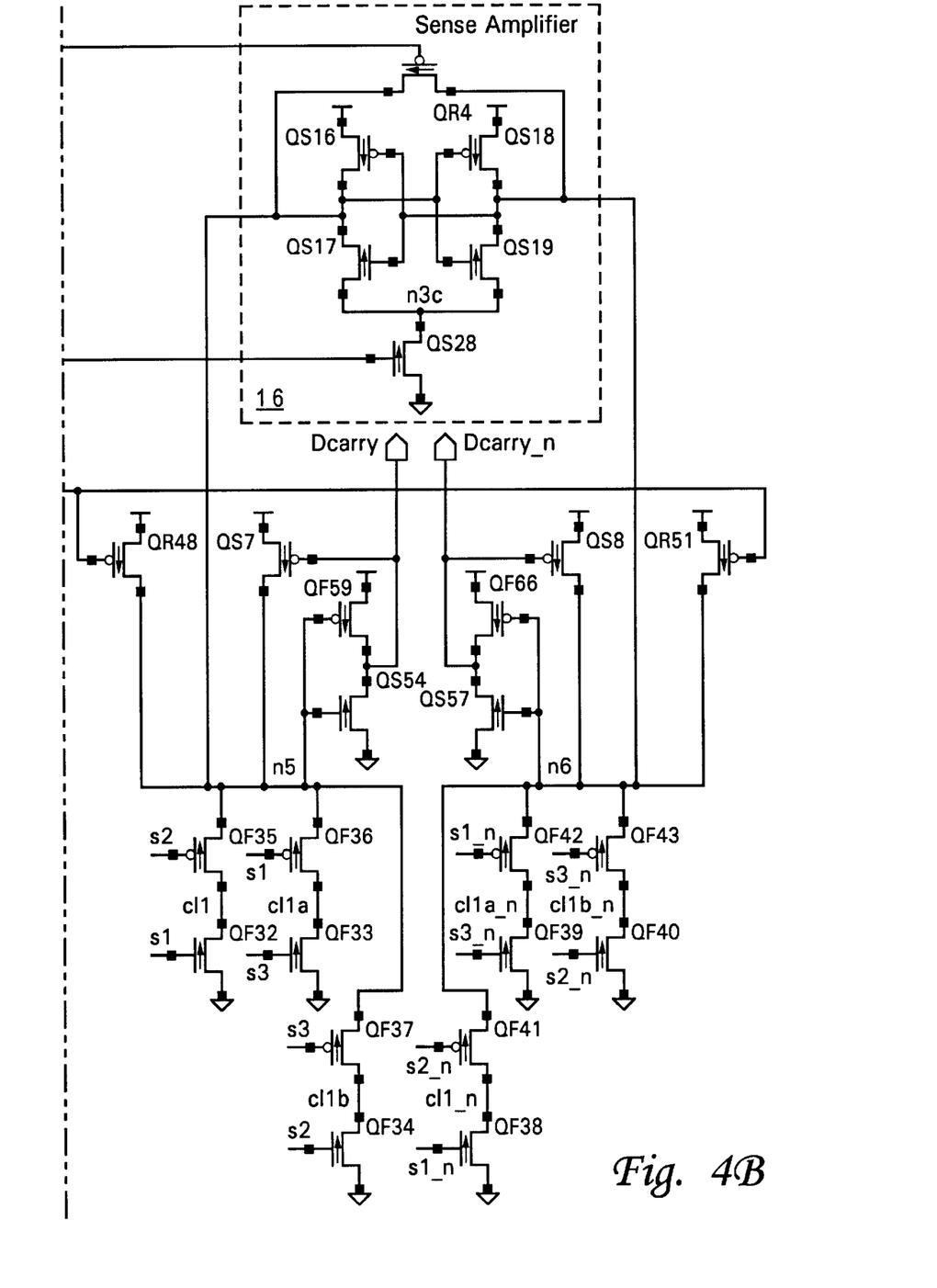

A second embodiment of the present invention is application in differential logic. Referring now to FIG. 4, an application of the present invention to a dual rail non-footed logic circuit is shown. This circuit is a standard carry-save adder, which is well known in the art, further comprising two rate increasing means as described in the first embodiment, one for each evaluating circuit. In this topology, CMOS sense amplifiers 14 and 16 provide rate increasing means to the complementary evaluation nodes n3 and n4 of the sum evaluator and nodes n5 and n6 of the carry evaluator, respectively. The operation is identical, but the half-latches of first embodiment are replaced by PFET QS5 and QS6. QS5 is driven directly by the output inverter formed by QF30 and QF25 and QS6 is driven by QF31 and QS28. The structure is identical in operation to the half-latches used in the first embodiment, but saves four transistors per gate in this case, since an inverter is already available attached to each of nodes n3, n4, n5, and n6. The separate reset PFET QR2 (FIG. 2) of the first embodiment is not needed, as the connection of the in this circuit provides that both terminals are precharged in precharge state. Node n3 is pulled high in the precharge state by PFET QR19 and node n4 is pulled high by the PFET QR22.

Figure 5:
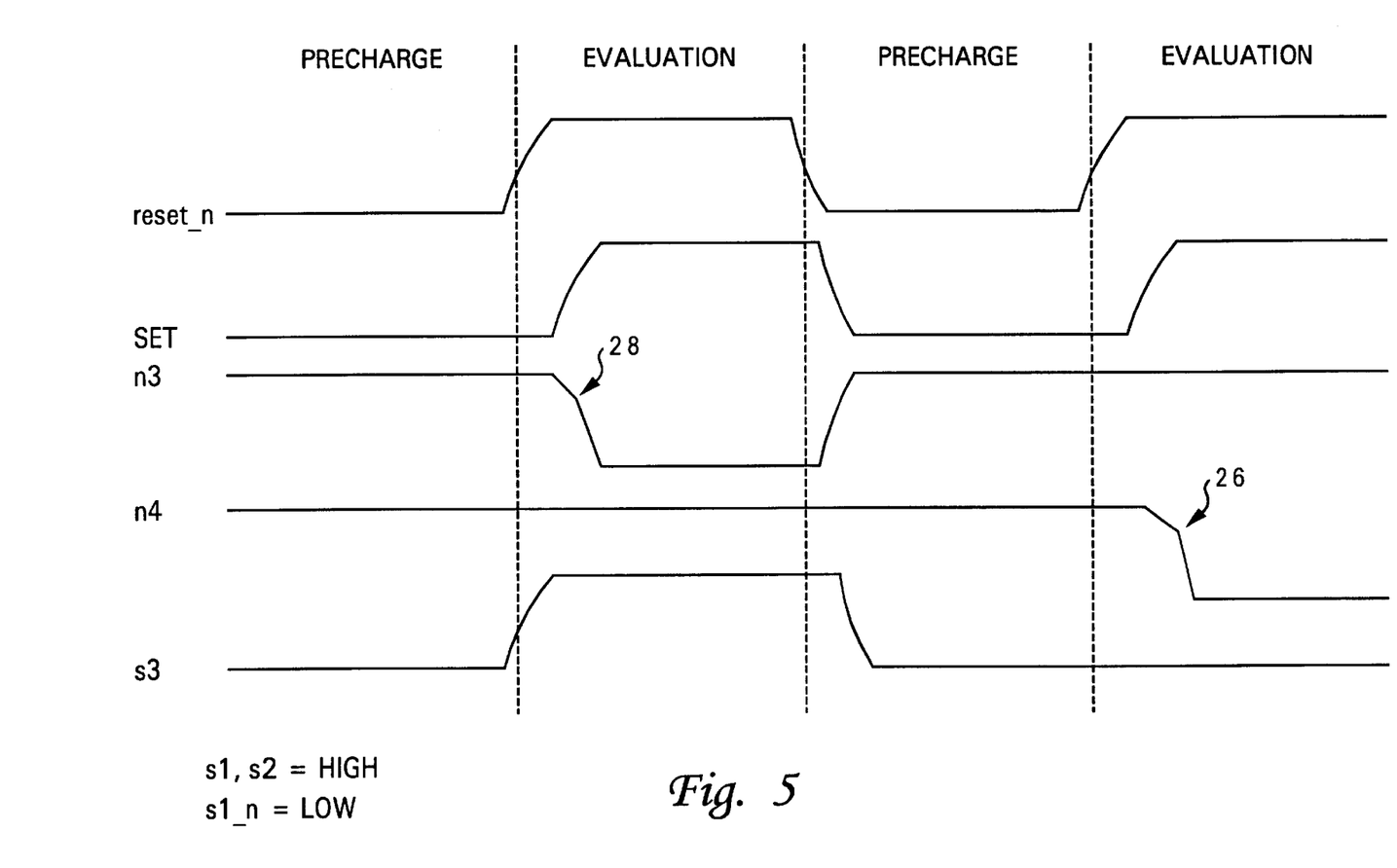
FIG. 5 is an electrical timing diagram showing the relationship of voltages in the operation of the circuit of FIG. 4.

FIG. 5 shows the complementary action of nodes n3 and n4 by way of example. Note that due to the complementary logic, one of nodes n3 and n4 will always evaluate to the low state, and therefore the amplifier does not have an event 22 (FIG. 3) where the relative capacitance of the nodes determines the output state. Events 26 and 28 show similar slope improvements as for event 24 (FIG. 3).

Figure 6:
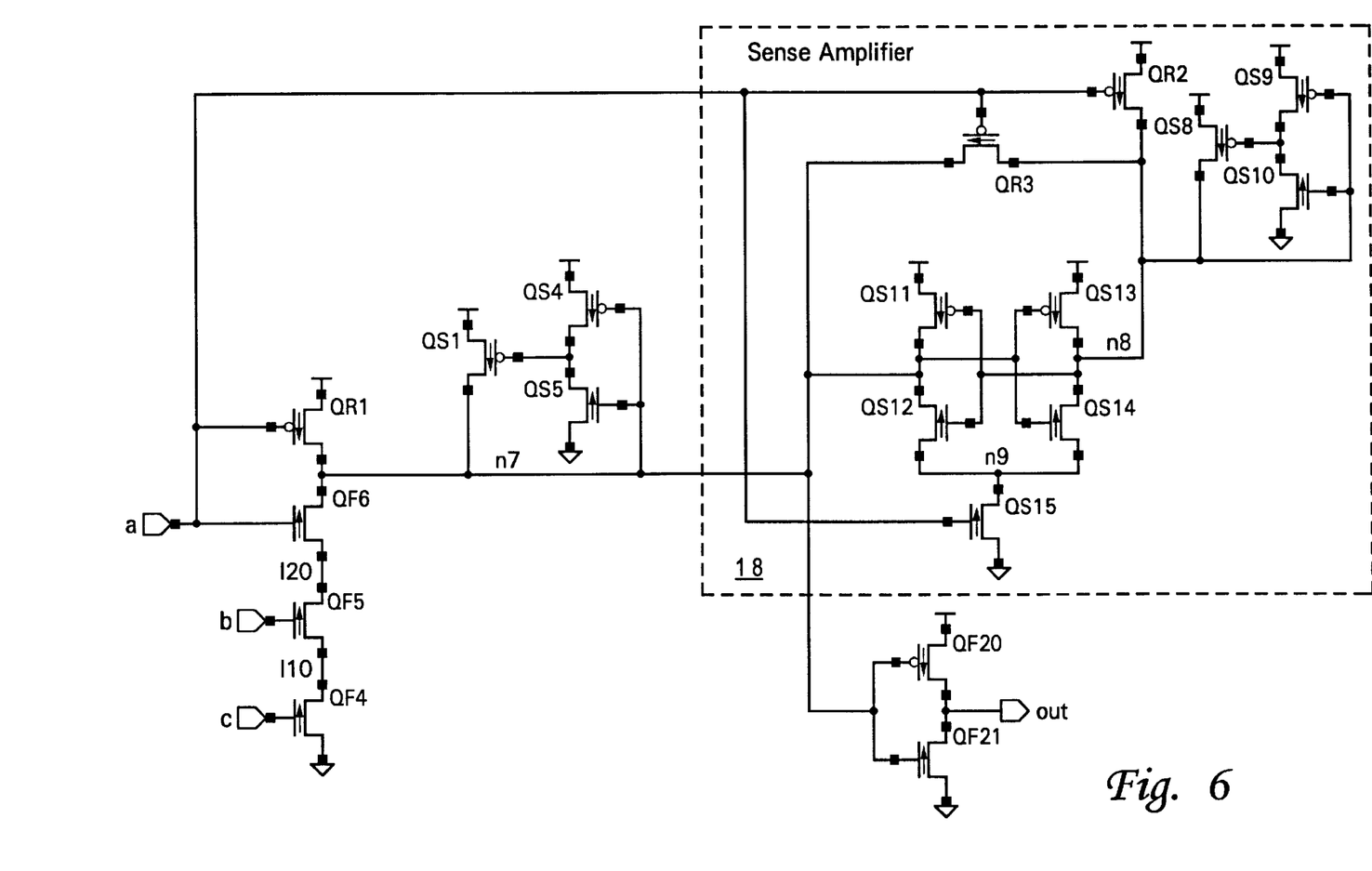
FIG. 6 is an electrical schematic of a pseudo clocked dynamic AND gate with a cross-coupled sense amplifier connected to increase the rate of change of the evaluating node.

Referring now to FIG. 6, a third embodiment of an enhanced dynamic logic circuit is shown. This topology is known in the art as pseudo-clocked logic. In this circuit, there is no separate reset signal to provide the precharge state control. Input a is designated as the last arriving input signal, and the circuit will remain in the precharge state until input a is high. Transistors QS1, QS4 and QS5 form a half-latch to maintain node n7 in the high state until overcome by the action of the input ladder formed by NFETS QF4, QF5, and QF6. Node n7 will remain in the high state unless all of the ladder transistors are on. QF20 and QF21 comprise an inverter, so this gate performs a logical AND operation.

Figure 7:
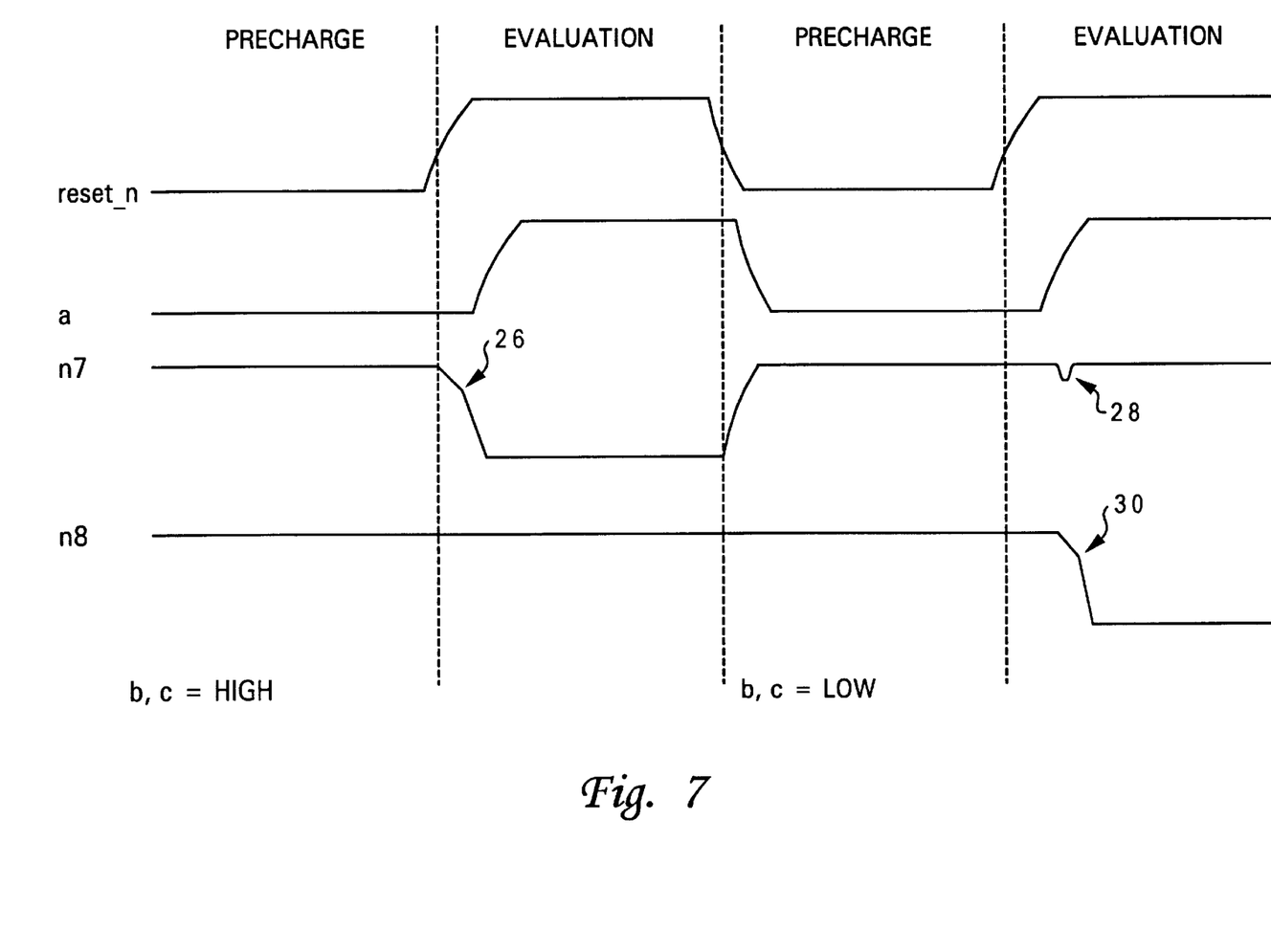
FIG. 7 is an electrical timing diagram showing the relationship of voltages in the operation of the circuit of FIG. 6.

CMOS cross-coupled amplifier 18 performs as in the first embodiment, with the difference that the shunt transistor QR3 and precharge transistor for node n8 are driven by input a. When input a is low, the amplifier will be shunted and node n8 will be precharged high. Referring additionally now to FIG. 7, the operation can be seen as similar to the operation of the first embodiment. When inputs b and c are high, the input ladder causes n7 to evaluate low. Rate change event 26 occurs due to the action of the cross-coupled amplifier 18. When input b or c is low, node n7 evaluates high, and the lower capacitance of node n8 causes it to drive toward the ground state 30 in preference to node n7 which drives back toward the power supply rail 28(FIG. 7).

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, rate increasing means could be applied to other logic families such as Silicon-On-Sapphire. It is therefore contemplated that such modifications can be made without departing from the spirit or scope of the present invention as defined in the appended claims.

What is claimed is:

1. A dynamic logic gate comprising:
   at least one input ladder that evaluates a combination of logic signals by discharging a precharge potential at a logical evaluation node during an evaluation phase;
   a cross-coupled amplifier that provides a parallel discharge path from said logical evaluation node, wherein said cross-coupled amplifier includes:
      a first input terminal coupled to said logical evaluation node; and
      a second input terminal;
   switching means for shunting said first input terminal with said second input terminal during a precharge phase and for opening said shunt during an evaluation phase; and
   switching means for selectively delaying application of said parallel discharge path to said logical evaluation node until after an evaluation phase has begun.

2. The dynamic logic gate of claim 1, further comprising ladder precharge means coupled to said input ladder for precharging said input ladder to reduce evaluation time.

3. The dynamic logic gate of claim 2, further comprising latching means for maintaining a precharge state.

4. The dynamic logic gate of claim 1, further comprising latching means for maintaining a precharge state.

5. The dynamic logic gate of claim 3, wherein said latching means comprises a half latch.

6. The dynamic logic gate of claim 1, wherein said cross-coupled amplifier is a CMOS cross-coupled amplifier.

7. The dynamic logic gate of claim 1, further comprising amplifier precharge means coupled to said cross-coupled amplifier for maintaining said cross-coupled amplifier in a precharge state.

8. The dynamic logic gate of claim 7, wherein said amplifier precharge means comprises a half latch.

9. The dynamic logic gate of claim 7, wherein said amplifier precharge means comprises a half latch.

10. The dynamic logic gate of claim 7, further comprising shunt means coupled to said cross-coupled amplifier for maintaining a first voltage of said first input terminal equal to a second voltage of said second input terminal.

11. The dynamic logic gate of claim 7, wherein said amplifier precharge means is a CMOS amplifier.

12. A method for utilizing a cross-coupled amplifier to reduce the evaluation time of a dynamic circuit, said method comprising:
   utilizing a cross-coupled amplifier to sense the direction of change of a voltage at a logical evaluation node; and
   detecting that a voltage of said logical evaluation node is evaluating to a non-precharge state, and in response thereto, applying an additional discharge path from said evaluation node through said cross-coupled amplifier.

* * * * *

UNITED STATES PATENT AND TRADEMARK OFFICE
CERTIFICATE OF CORRECTION

PATENT NO. : 6,285,217 B1
DATED : September 4, 2001
INVENTOR(S) : Durham et al.

It is certified that error appears in the above-identified patent and that said Letters Patent is hereby corrected as shown below:

Title page,
Item [75], Inventors, delete "Lofti" and insert -- Lotfi --

Column 3,
Line 46, delete "nil" and insert -- n1 --

Signed and Sealed this

Ninth Day of April, 2002

Attest:

JAMES E. ROGAN
*Director of the United States Patent and Trademark Office*

*Attesting Officer*